(12) United States Patent
Getman et al.

(10) Patent No.: US 9,442,033 B2
(45) Date of Patent: Sep. 13, 2016

(54) PRESSURE DIFFERENCE SENSOR AND METHOD FOR ITS MANUFACTURE

(71) Applicant: Endress + Hauser GmbH + Co. KG, Maulburg (DE)

(72) Inventors: Igor Getman, Lorrach (DE); Rafael Teipen, Berlin (DE); Thomas Link, Rottweil (DE); Peter Nommensen, Villingen-Schwenningen (DE)

(73) Assignee: Endress + GmbH + Co. KG, Maulburg (DE)

( * ) Notice: Subject to any disclaimer, the term of this patent is extended or adjusted under 35 U.S.C. 154(b) by 0 days.

(21) Appl. No.: 14/434,172

(22) PCT Filed: Sep. 24, 2013

(86) PCT No.: PCT/EP2013/069766
§ 371 (c)(1),
(2) Date: Apr. 8, 2015

(87) PCT Pub. No.: WO2014/056715
PCT Pub. Date: Apr. 17, 2014

(65) Prior Publication Data
US 2015/0260598 A1    Sep. 17, 2015

(30) Foreign Application Priority Data
Oct. 9, 2012    (DE) .................. 10 2012 109 587

(51) Int. Cl.
| G01L 9/12 | (2006.01) |
| G01L 9/00 | (2006.01) |
| G01L 13/02 | (2006.01) |
| G01L 19/06 | (2006.01) |

(Continued)

(52) U.S. Cl.
CPC .......... *G01L 9/0072* (2013.01); *B81B 3/0027* (2013.01); *B81C 1/00531* (2013.01); *G01L 9/0073* (2013.01); *G01L 13/025* (2013.01); *G01L 19/0618* (2013.01); *B81B 2201/0264* (2013.01); *B81B 2203/0127* (2013.01); *B81C 1/00158* (2013.01); *B81C 1/00396* (2013.01)

(58) Field of Classification Search
USPC .............. 73/724, 718, 716, 754, 514.32; 257/419; 216/2; 29/621.1
See application file for complete search history.

(56) References Cited

U.S. PATENT DOCUMENTS

| 4,766,666 A * | 8/1988 | Sugiyama | ............. G01L 9/0042 29/454 |
| 5,552,015 A * | 9/1996 | Arndt | ................. B81C 1/00103 216/2 |
| 8,104,353 B2 * | 1/2012 | Drewes | ................ G01L 9/0075 29/825 |

(Continued)

*Primary Examiner* — Jewel V Thompson
(74) *Attorney, Agent, or Firm* — Bacon & Thomas, PLLC

(57) ABSTRACT

A pressure difference sensor includes a measuring membrane, which is arranged between two platforms and connected pressure-tightly with the platforms, in each case, via a first insulating layer for forming pressure chambers between the platforms and the measuring membrane. The insulating layer is especially silicon oxide, wherein the pressure difference sensor further includes an electrical transducer for registering a pressure dependent deflection of the measuring membrane. The platforms have support positions, against which the measuring membrane lies at least partially in the case of overload, wherein the support positions have position dependent heights, characterized in that the support positions are formed in the first insulating layer by isotropic etching, and the particular height h of a support position, in each case, is a function of a distance from a base of the support position in the reference plane.

18 Claims, 4 Drawing Sheets

(51) Int. Cl.
  *B81B 3/00*    (2006.01)
  *B81C 1/00*    (2006.01)

(56)  References Cited

U.S. PATENT DOCUMENTS

| | | | | |
|---|---|---|---|---|
| 8,402,836 | B2* | 3/2013 | Dannhauer | G01L 9/0073 73/716 |
| 8,966,989 | B2* | 3/2015 | Drewes | G01L 9/0075 73/718 |
| 8,975,714 | B2* | 3/2015 | Nakatani | G01L 1/148 257/419 |
| 8,991,262 | B2* | 3/2015 | Nakatani | G01L 9/0073 257/415 |
| 9,038,466 | B2* | 5/2015 | Reinmuth | G01L 9/005 361/280 |
| 2015/0135844 | A1* | 5/2015 | Ponath | B23K 1/0008 73/724 |

* cited by examiner

PRESSURE DIFFERENCE SENSOR AND METHOD FOR ITS MANUFACTURE

TECHNICAL FIELD

The present invention relates to a pressure difference sensor and a method for its manufacture.

BACKGROUND DISCUSSION

Pressure difference sensors measure, in accordance with their purpose, measure the pressure difference between a first media pressure and a second media pressure, wherein the range of the pressure difference to be measured is significantly less than the first, respectively the second media pressure. This leads to conflicting goals in the design of the pressure difference sensor, for, on the one hand, it should be able to measure a small pressure difference and, on the other hand, it must withstand high media pressures, wherein, especially in the case of incorrect operation, the pressure difference can indeed reach the order of magnitude of the media pressure. Without protective measures, a measuring membrane of a pressure difference sensor can be destroyed by such a high pressure difference.

Known in the way of protective measures are, for example, overload membranes, which prevent a rise of the pressure difference above a critical value. These overload membranes are integrated in hydraulic measuring aids, which supply the first and second media pressures by means of pressure transfer liquid via hydraulic paths extending, in each case, from a separating diaphragm chamber, which is covered with an isolating diaphragm, to respective sides of the measuring membrane. The overload membrane is connected in parallel with the pressure difference sensor, respectively its measuring membrane. When now the pressure difference exceeds a critical value, the overload membrane is deflected sufficiently far that the entire volume of the pressure transfer liquid in the separating diaphragm chamber on the side of the higher pressure is absorbed by the overload membrane, and the isolating diaphragm comes to rest. Therewith, a further rise of the pressure difference is reliably prevented. The use of overload membranes leads, however, absolutely to greater volume strokes of the pressure transfer liquid and therewith—at equal performance—to greater separating diaphragm areas, which means greater device dimensions and higher costs. Moreover, the measuring mechanism dynamic is influenced negatively by the overload membrane and the greater volume of pressure transfer liquid.

There are, consequently, efforts known, which are directed toward implementing the overload protection for the measuring membrane by membrane beds. In such case, the measuring membrane should upon the exceeding of a limit value for the positive pressure be supported on the membrane bed at least to a degree that the bursting stress of the measuring membrane is not reached even in the case of additional pressure rise.

For such purpose, especially aspherical membrane beds are suitable, which approximate the bend line of the measuring membrane at the limit value for the positive pressure.

The U.S. Pat. No. 4,458,537 discloses a capacitive pressure difference sensor having an aspherical diaphragm bed of glass, which is produced in a structure of coaxial rings, wherein the heights of the rings form a contour, which corresponds to the bend line of the measuring membrane.

Offenlegungsschrift (laid open German application) DE 10 2009 046 229 A1 discloses a pressure sensor, respectively pressure difference sensor, having an aspherical diaphragm bed of glass, which is formed by thermal molding.

U.S. Pat. No. 7,360,431 B2 discloses a pressure sensor, respectively pressure difference sensor, having an aspherical diaphragm bed, which is prepared in silicon by means of grayscale lithography.

Offenlegungsschrift (laid open German application) DE 10 2010 028 773 A1 discloses a pressure sensor, respectively pressure difference sensor, having an aspherical diaphragm bed, which is prepared in silicon by means of laser ablation, followed by an oxidation step and terminal etching.

Japanese Patent JP10078366A discloses a resistive semiconductor pressure sensor having a stepped diaphragm bed, which is prepared in silicon.

U.S. Pat. No. 5,381,299 discloses a capacitive pressure sensor manufactured from silicon with a stepped diaphragm bed, which approximates the bend line of the measuring membrane, wherein the envelope curve of the membrane bed in the central region has a greater radius of curvature then the measuring membrane.

The mentioned pressure sensors have membrane beds, which basically satisfy the mentioned purpose. However, the preparation of the membrane beds, respectively their integration into a pressure sensor, is complex.

SUMMARY OF THE INVENTION

It is, therefore, an object of the present invention to provide a simply manufacturable, overload resistant, pressure difference sensor and a method for its manufacture.

The object is achieved according to the invention by a pressure difference sensor which includes: a measuring membrane; a first platform; a second platform; wherein the measuring membrane is arranged between the first and second platforms, wherein the measuring membrane is connected pressure-tightly with the first platform and the second platform, in each case, via a first insulating layer for forming a first, respectively second, pressure chamber between the platforms and the measuring membrane, wherein the pressure difference sensor further includes an electrical transducer for registering a pressure dependent deflection of the measuring membrane, wherein the first platform and/or the second platform have has support positions, against which the measuring membrane lies at least partially in the case unilateral overload, wherein the support positions have position dependent heights h with respect to a reference plane, which extends parallel to a plane, which is defined by the measuring membrane, wherein according to the invention the support positions are formed in the first insulating layer by isotropic etching, and the particular height h of a support position, in each case, is a function of a distance from a base of the support position in the reference plane.

The reference plane can especially be a plane, against which a center of the measuring membrane lies in the case of overload.

The insulating layer according to a further development of the invention comprises especially silicon oxide.

In a further development of the invention, the height of a support position is a monotonic function of the respective minimum distance from the base of the support position in the reference plane to the location of the height h of the support positions. In a further development of the invention, the measuring membrane includes a circular, deflectable region, and wherein at least one support position has a circularly shaped or circular arc shaped curve coaxial with the measuring membrane, wherein the support position has at least sectionally a constant height.

In a further development of the invention, the measuring membrane has a circular, deflectable region, and wherein at least one support position has with reference to an axis extending perpendicular to the circular area through its midpoint a radial course, wherein the support position has at least sectionally a height h varying with radial position.

In a further development of the invention, the support positions have in an inner radial region of the pressure chamber a circularly shaped or circular arc shaped curve.

In a further development of the invention, the support positions have a radial course in an outer radial region of the pressure chamber.

In a further development of the invention, the electrical transducer comprises a capacitive transducer, which includes at least one platform electrode, which is electrically isolated from the measuring membrane, and whose capacitance relative to the measuring membrane depends on a pressure difference to be measured.

In a further development of the invention, the at least one platform electrode is surrounded by an annular space, wherein the platform electrode is electrically isolated by the space from a part of the platform surrounding the space.

In a further development of the invention, the space has a width, which amounts to at least 20-times, preferably at least 40-times and especially at least 80-times the distance between the platform electrode and the measuring membrane in the resting position of the measuring membrane.

In a further development of the invention, the measuring membrane includes a deflectable region, whose diameter amounts to at least 200-times, especially at least 400-times and preferably at least 800-times the distance between the measuring membrane in the resting position and the at least one platform electrode.

In a further development of the invention, the thickness of the first insulating layer amounts to no more than 16 µm, especially no more than 8 µm and preferably no more than 4 µm.

In a further development of the invention, the platform has a layer structure with a first conductive layer and a second conductive layer, which are isolated from one another by a second insulating layer, wherein the first conductive layer faces the measuring membrane and comprises the platform electrode, wherein the space extends through the first conductive layer to the second insulating layer.

In a further development of the invention, the second insulating layer has a thickness, which amounts to not less than the thickness of the first insulating layer, wherein the thickness of the second insulating layer especially amounts to not less than twice, preferably not less than triple, that of the first insulating layer.

In a further development of the invention, the platform has a planar surface section, from which the support positions rise, wherein the surface section is limited by the space, wherein the surface section has on no more than 20%, especially no more than 10% and preferably no more than 7.5% of its surface raised portions of support positions.

The method of the invention for preparing a platform for a pressure difference sensor includes the steps of: providing an at least sectionally conductive body, which has a cover layer of an electrically insulating material; masking the cover layer with an etching mask, wherein the etching mask is to be at least sectionally underetched in a time governed, isotropic etching process, in order to remove the cover layer in a region of the body except for support positions with position dependent heights, wherein the etching mask has perforations, through which an etching solution can attack the cover layer, wherein the separation between neighboring perforations, between which support positions are to be prepared, varies as a function of desired height, respectively desired height excursion, of the support position, wherein the separation increases with increasing height of the support position; etching the cover layer through the etching mask; stopping the etching procedure after a predetermined time; and removing the etching mask.

In a further development of the invention, the conductive body is silicon and the cover layer is amorphous silicon dioxide.

In a further development of the invention, the mask is chromium or a photoresist, or it is a hardmask, especially a metal hardmask.

In a further development of the invention, the etching occurs by means of HF, wherein the HF is provided especially pure or diluted.

In a further development of the invention, the etching includes a dry chemical etching method, especially by applying $SF_6$, especially RIE or DRIE.

BRIEF DESCRIPTION OF THE DRAWINGS

The invention will now be explained in greater detail based on the examples of embodiments illustrated in the drawing, the figures of which show as follows.

DETAILED DISCUSSION IN CONJUNCTION WITH THE DRAWINGS

Figure 1:
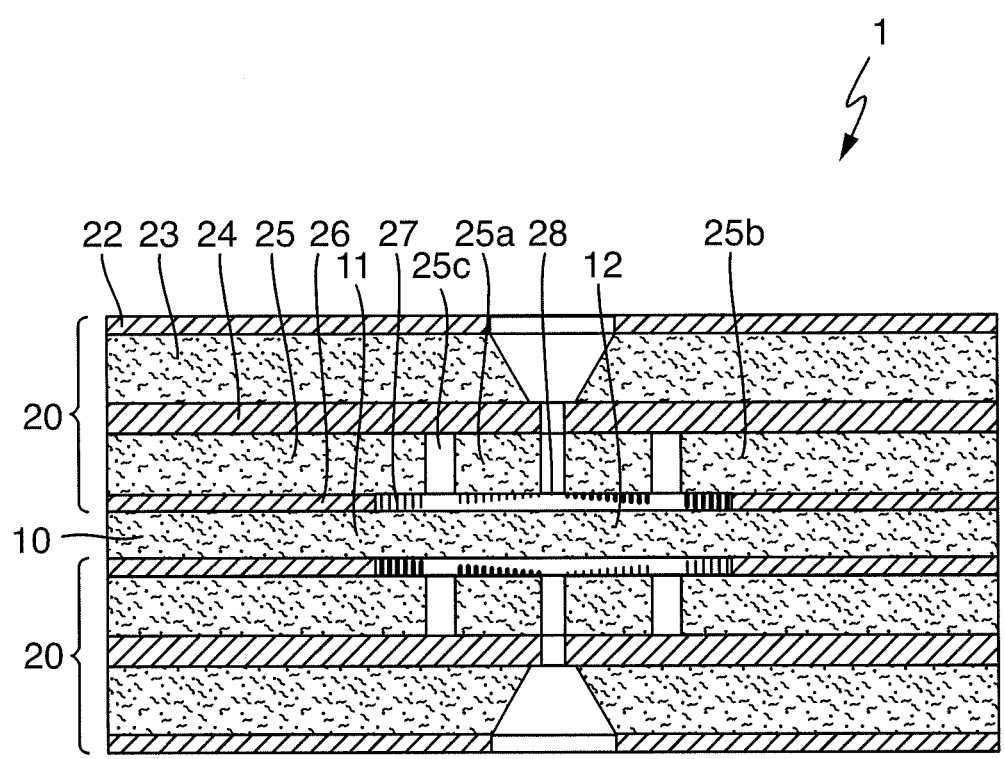
FIG. 1 is a schematic longitudinal section through an example of an embodiment of a pressure difference sensor of the invention.

The pressure difference sensor 1 shown in FIG. 1 includes a measuring membrane 10 of silicon, which is arranged between two platforms 20 and connected pressure-tightly with both platforms 20 along an annular edge region 11, which surrounds a circular disk shaped, deflectable region 12. The measuring membrane has a thickness of a few 10s of µm, for example about 40 µm, wherein the thickness of the measuring membrane is selected relative to the radius of the deflectable region as a function of the desired measuring range. In the present example of an embodiment, the radius of the deflectable region 12 of the measuring membrane amounts to, for instance, 1100 µm.

The two platforms 20 have preferably, with reference to a central plane of the measuring membrane, a micromechanically essentially symmetric construction, so that the following description of the structure of one platform 20 also holds for the other platform 20. Platform 20 has a layer structure, whose layer sequence will now be described from the outside inwards.

Platform 20 has on its outer surface a first insulation layer 22, which is preferably $SiO_2$, and has, for example, a thickness of a few µm, especially less than 5 µm, preferably 2 µm. The first insulation layer 22 covers a support layer 23, which has a thickness of a few hundred micrometers, especially, for instance, 300 µm, wherein the support layer 23 is especially silicon. Following support layer 23 is a second insulation layer 24, which has, for example, a thickness of 4 μm, and is preferably SiO$_2$. The second insulation layer 24 insulates the support layer 23 from an electrode layer 25, which has, for example, a thickness of 50 μm and is preferably Si. The electrode layer 25 includes a central platform electrode 25a with a radius of, for instance, 750 μm and an edge region 25b surrounding the platform electrode, wherein the platform electrode 25a and the edge region 25b are isolated from one another by an annular space 25c. The space 25c has, for example, a width of 50 μm. Following the electrode layer 25 is a third insulation layer 26, whose central region is except for support positions 27 etched away. The third insulation layer 26 has a thickness of, for example, 2 μm. An edge region the third insulation layer 26, which annularly surrounds the support positions 27, is connected pressure-tightly with the measuring membrane 10, for example, via a fusion bond, especially a high temperature, fusion bond.

The support positions have a separation from one another of no more than a few 10s of μm, for example, 20 μm to 30 μm.

Sense and purpose of the support positions 27 is to support the measuring membrane 12 in the case of overload, thus to assure that the measuring membrane, beyond a certain overload pressure, lies against the support positions, and therewith, further deflection of the measuring membrane is prevented, respectively lessened, in order to keep the tensile stresses in the measuring membrane below the bursting stress of the material, here Si.

Based on their purpose, the support positions 27 must, on the one hand, be arranged sufficiently densely, in order to keep the stresses under the bursting stress in the case of expected overload pressure.

The support positions have from one another a separation of no more than a few 10s of μm, for example, no more than 80 μm, especially no more than 40 μm, preferably 20 μm to 30 μm. In the case of annular support positions, a constant separation between two neighboring concentric rings can be used. In the case of radially extending support positions, the separation varies with the radius.

Of course, also other forms can be used for the support positions.

In order to support the measuring membrane as intended, the support positions have effective heights h(r) as a function of the radius r. The effective heights h(r) increase monotonically with the radius. The effective heights are the heights of those regions of the support positions, against which the measuring membrane comes to rest.

The effective heights h(r) can correspond, for example, to the respective height of the bend line, $d \cdot [1-(1-(r/R_0)^2)^2]$, of the measuring membrane, while also simpler forms, such as $d \cdot (r/R_0)$ can already offer an effective support, wherein d is the separation between the deflectable region 12 of the measuring membrane and the central electrode 25a, and $R_0$ is the radius of the deflectable region 12 of the measuring membrane. Fundamentally, also any other functions h(r) are suitable, which prevent an excessive deflection of the measuring membrane.

Support positions are especially desired in the radial regions, where high stresses are to be expected in the case of a deflection of the measuring membrane, in order to limit these stresses. Such is especially the case at the outer edge of the deflectable region 12 of the measuring membrane. Thus, it makes sense to provide support positions in the vicinity of the edge. Influencing this is the positioning and dimensioning of the space 25c between the central platform electrode 25a and the edge region 25b. The space 25c limits with its inner radius $r_i$, on the one hand, the area of the platform electrode 25a and therewith its capacitance in combination with the measuring membrane. On the other hand, the space 25c serves to lessen a stray capacitance of the platform electrode 25a formed with the edge region 25b. In this regard, a minimum space width of $r_o$-$r_i$ of a few 10s of μm, for example, 50 μm, is advantageous. In order nevertheless not to overly limit the capacitance between the measuring membrane 12 and the platform electrode, one would want in the case of given width $r_a$-$r_i$, firstly, to position the space as far as possible outwards, so that $r_o$=$R_0$, wherein $R_0$ is the radius of the deflectable region 12 of the measuring membrane. Weighing against this, however, is the idea of offsetting the space by a few 100s of μm, for example, about 300 μm, inwardly, in order to be able to provide, between the outer radius $r_o$ of the space and the radius $R_0$ of the deflectable region 12 of the measuring membrane, some support positions 27, in order to be able to unload the measuring membrane 10 exactly in this region of highest tensile stresses in the case of overload.

The preparation of the support positions 27 by etching parts of the third insulation layer 26 will now be explained schematically based on FIG. 2.

Figure 2A:
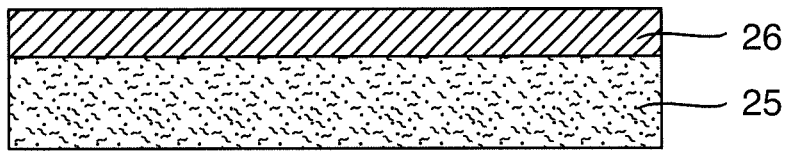
FIGS. 2a-2e show a schematic representation of the step sequence of an example of an embodiment of a method for preparing support positions on a platform surface.
Figure 2B:
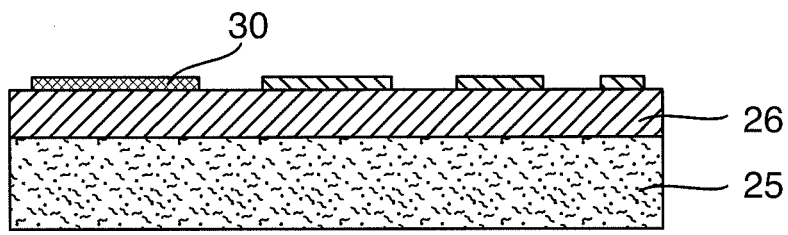

FIG. 2a shows a section of the third insulation layer 26 on the electrode layer 25. Prepared on the third insulation layer 26 is a partially perforated etching mask 30, such as shown in FIG. 2b. The mask can comprise, for example, chromium or a photoresist, or be prepared of a hardmask of metal such as aluminum or gold.

Figure 2C:
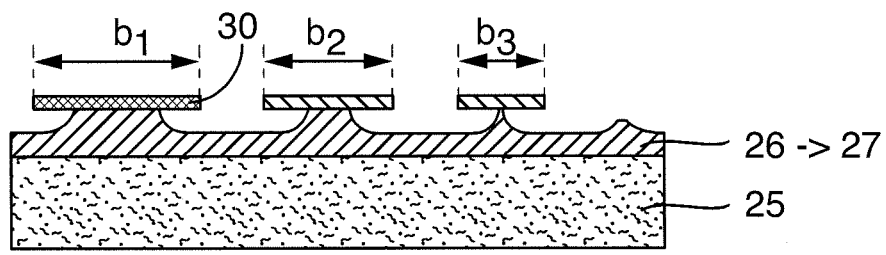
Figure 2D:
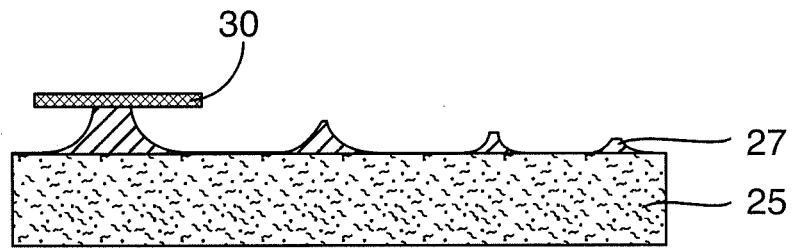

In an isotropic etching process, which is shown in FIGS. 2c and 2d, the mask 30 is partially underetched, wherein the etching process is continued until the third insulation layer 26, but not the electrode layer 25, is completely etched away in those regions, which are not protected by the mask 30. There remain only support positions 27, whose heights above the surface of the electrode layer 25 result from the widths $b_i$ (i=1, 2, 3, . . . ) of the covering mask regions, such as shown in FIG. 2c. In order namely to etch away the third oxide layer 26 under a covering region of the mask, there must occur, first of all, a lateral underetching, until the two etch fronts come together in the middle of the covered range. Only from this point in time is the height of the covered region reduced.

Since the time until the etch fronts in the case of underetching come together depends on the widths of the covered regions, and since the total time for the etching procedure is held constant, the remaining heights can be controlled via the widths of the covered ranges.

Figure 2E:
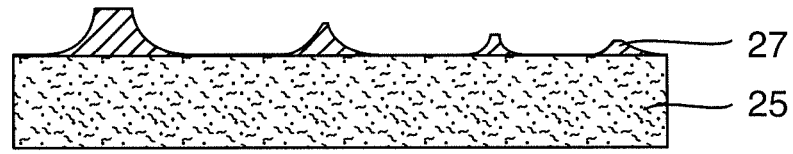

After removing the etching mask, there remain support positions 27, such as shown in FIG. 2e.

FIG. 3 shows examples of masks with radially extending masking strips whose width, in each case, increases with the radius, in order to prepare support positions with a corresponding rise of the effective heights.

Figure 3A:
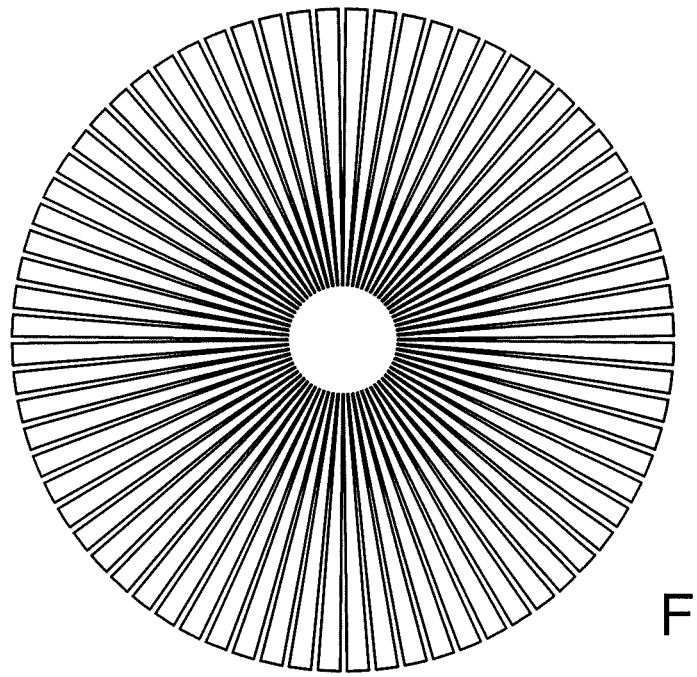
FIGS. 3a-3b are representations of masks for preparing support positions of the invention on a platform surface.
Figure 3B:
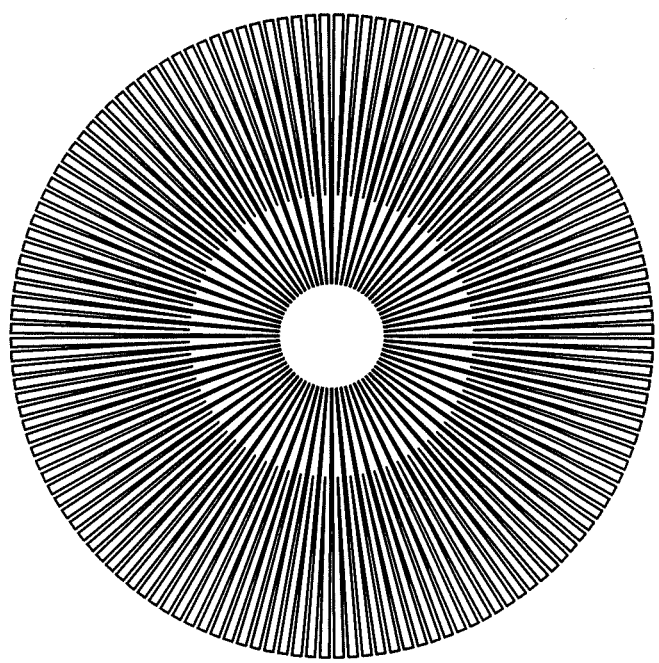

In such case, the masks in FIGS. 3a and 3b differ in that the individual masking strips in FIG. 3a cover a greater angle range than those in FIG. 3b. This tends to lead—at least in the case of small radii—to a tighter structure.

Especially when radial masking strips in the region of greater radii are present in a high numerical density N/ϕ, it can make sense in the case of smaller radii to lessen the number density, in order to enable still sufficient distances for a defined etching process between the masking strips. The number density can especially be reduced by having only every second, third or n-th masking strip extend to the smaller radii, such as shown in FIG. 3b.

FIG. 4 shows, finally, REM pictures of support positions 27, 127, which were prepared by underetching in the third insulation layer 25.

Figure 4A:
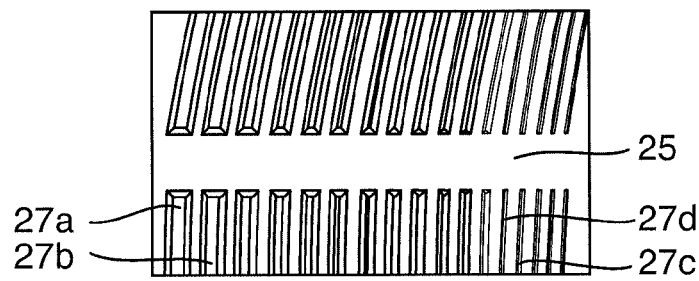
FIGS. 4a-4c are REM pictures of platform surfaces with support positions.

FIG. 4a shows concentric ring segments 27a, . . . , 27d on the electrode layer 25, wherein the ring segments 27a, 27b at larger radii have a greater effective height h than the ring segments 27c, 27d at smaller radii. The higher support positions formed by the outer ring segments 27a, 27b have because of the earlier described reasons also a greater width than the lower support positions formed by the inner ring segments 27c, 27b. Actually it is even the case that the outer ring segments here have such a width that there was not a complete underetching in their preparation. I.e., the outer ring segments have, in each case, a plateau of constant height, wherein the height is predetermined by the material thickness of the oxide layer.

The shown radial passageway between the ring segments facilitates the filling of the cavity between the measuring membrane and the electrode layer with a pressure transfer medium, for example, an oil.

Figure 4B:
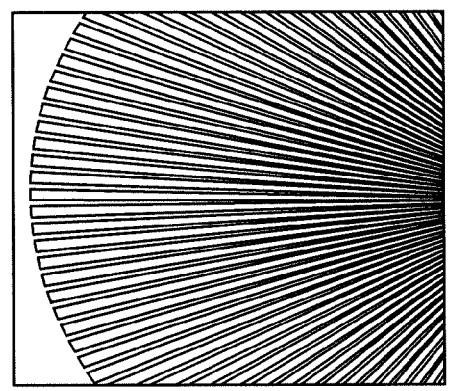
Figure 4C:
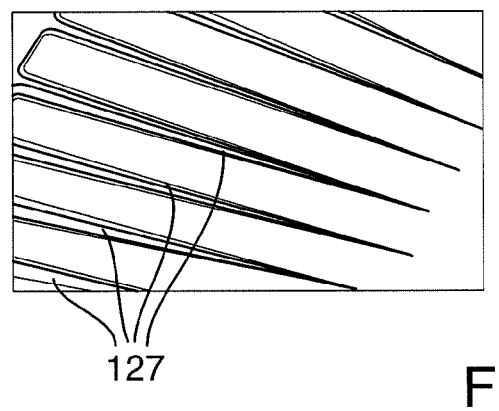

FIGS. 4b and 4c show radially extending support positions 127 of different numerical densities N/φ.

The invention claimed is:

1. A pressure difference sensor, comprising:
a measuring membrane;
a first platform;
a second platform; and
an electrical transducer for registering a pressure dependent deflection of the measuring membrane, wherein:
said measuring membrane is arranged between said first and said second platforms;
said measuring membrane is connected pressure-tightly with said first platform and said second platform, in each case, via a first insulating layer for forming a first, respectively second, pressure chamber between said platforms and said measuring membrane;
said insulating layer comprises especially silicon oxide;
wherein said first platform and/or said second platform have/has support positions, against which said measuring membrane lies at least partially in the case of unilateral overload;
said support positions have position dependent heights with respect to a reference plane, which extends parallel to a plane, which is defined by said measuring membrane;
said support positions are formed in said first insulating layer by isotropic etching, and the particular height of a support position, in each case, is a function of a distance from a base of said support position in the reference plane.

2. The pressure difference sensor as claimed in claim 1, wherein:
the height of a support position is a monotonic function of the respective minimum distance from the base of said support position in the reference plane to the location of the height of said support positions.

3. The pressure difference sensor as claimed in claim 1, wherein:
said measuring membrane includes a circular, deflectable region;
at least one support position has a circularly shaped or circular arc shaped curve coaxial with said measuring membrane, and
said support position has at least sectionally a constant height.

4. The pressure difference sensor as claimed in claim 1, wherein:
said measuring membrane has a circular, deflectable region;
at least one support position has, with reference to an axis extending perpendicular to the circular area through its midpoint, a radial course;
said support position has at least sectionally a height varying with radial position.

5. The pressure difference sensor as claimed in claim 1, wherein:
said support positions have in an inner radial region of the pressure chamber a circularly shaped or circular arc shaped curve and/or in an outer radial region of the pressure chamber a radial course.

6. The pressure difference sensor as claimed in claim 1, wherein:
said electrical transducer comprises a capacitive transducer, which includes at least one platform electrode, which is electrically isolated from said measuring membrane, and whose capacitance relative to said measuring membrane depends on a pressure difference to be measured.

7. The pressure difference sensor as claimed in claim 6, wherein:
said at least one platform electrode is surrounded by an annular space; and
said platform electrode is electrically isolated by the space from a part of the platform surrounding the space.

8. The pressure difference sensor as claimed in claim 7, wherein:
said annular space has a width, which amounts to at least 20-times, preferably at least 40-times and especially at least 80-times the distance between said platform electrode and said measuring membrane in the resting position of said measuring membrane.

9. The pressure difference sensor as claimed in claim 6, wherein:
said measuring membrane includes a deflectable region, whose diameter amounts to at least 200-times, especially at least 400-times and preferably at least 800-times the distance between said measuring membrane in the resting position and said at least one platform electrode.

10. The pressure difference sensor as claimed in claim 1, wherein:
the thickness of said first insulating layer amounts to no more than 16 µm, especially no more than 8 µm and preferably no more than 4 µm.

11. The pressure difference sensor as claimed in claim 6, wherein:
said platform has a layer structure with a first conductive layer and a second conductive layer, which are isolated from one another by a second insulating layer;
said first conductive layer faces said measuring membrane and comprises said platform electrode; and
said annular space extends through said first conductive layer to said second insulating layer.

12. The pressure difference sensor as claimed in claim 11, wherein:
said second insulating layer has a thickness, which amounts to not less than the thickness of said first insulating layer; and
said thickness of said second insulating layer especially amounts to not less than twice, preferably not less than triple, that of the first insulating layer.

13. The pressure difference sensor as claimed in claim 7, wherein:
said platform has a planar surface section, from which said support positions rise;
said planar surface section is limited by the space, the surface section has on no more than 20%, especially no more than 10% and preferably no more than 7.5% of its surface raised portions of support positions.

14. A method for preparing a platform for a pressure difference sensor, especially as claimed in one of the preceding claims, wherein the method comprises the steps of:
providing an at least sectionally conductive body, which has a cover layer of an electrically insulating material;
masking the cover layer with an etching mask, wherein the etching mask is to be at least sectionally underetched in a time governed, isotropic etching process, in order to remove the cover layer in a region of the body except for support positions with position dependent heights, wherein the etching mask has perforations, through which an etching solution can attack the cover layer, wherein the separation between neighboring perforations, between which support position are to be prepared, varies as a function of desired height, respectively desired height excursion, of the support position, wherein the separation increases with increasing height of the support position;
etching the cover layer through the etching mask;
stopping the etching procedure after a predetermined time; and
removing the etching mask.

15. The method as claimed in claim 14, wherein:
the conductive body is silicon and the cover layer is amorphous silicon dioxide.

16. The method as claimed in claim 14, wherein:
the mask is chromium or a photoresist, or it is a hardmask, especially a metal hardmask.

17. The method as claimed in claim 14, wherein:
the etching occurs by means of HF, said HF is provided especially, pure, diluted or sputtered.

18. The method as claimed in claim 14, wherein:
the etching includes a dry chemical etching method, especially RIE or DRIE.

* * * * *